United States Patent
Choi

(10) Patent No.: US 10,752,232 B2
(45) Date of Patent: Aug. 25, 2020

(54) ELECTRONIC PARKING BRAKE SYSTEM IN VEHICLE AND METHOD OF CONTROLLING THE SAME

(71) Applicant: MANDO CORPORATION, Gyeonggi-do (KR)

(72) Inventor: Jong Jin Choi, Seoul (KR)

(73) Assignee: MANDO CORPORATION, Gyeonggi-Do (KR)

( * ) Notice: Subject to any disclaimer, the term of this patent is extended or adjusted under 35 U.S.C. 154(b) by 71 days.

(21) Appl. No.: 16/052,592

(22) Filed: Aug. 1, 2018

(65) Prior Publication Data
US 2019/0047537 A1    Feb. 14, 2019

(30) Foreign Application Priority Data
Aug. 8, 2017    (KR) .................... 10-2017-0100283

(51) Int. Cl.
| G01R 33/07 | (2006.01) |
| B60T 17/22 | (2006.01) |
| B60T 7/12 | (2006.01) |
| G01R 31/34 | (2020.01) |
| G01R 15/20 | (2006.01) |
| B60T 13/74 | (2006.01) |

(52) U.S. Cl.
CPC ............ B60T 17/221 (2013.01); B60T 7/12 (2013.01); B60T 13/741 (2013.01); B60T 17/22 (2013.01); G01R 15/202 (2013.01); G01R 31/34 (2013.01); B60T 13/74 (2013.01)

(58) Field of Classification Search
CPC ... B60T 7/02; B60T 7/12; B60T 13/58; B60T 13/74; B60T 13/665; B60T 17/12; B60T 17/221; B62D 5/049

USPC ............. 188/22, 156–164; 303/15, 20, 122; 701/22, 30, 70–72; 324/244, 260, 263, 324/529
See application file for complete search history.

(56) References Cited

U.S. PATENT DOCUMENTS

| 6,969,127 | B2 * | 11/2005 | Suzuki | B60T 13/741 303/122 |
| 7,299,905 | B2 * | 11/2007 | Yamaguchi | B60T 13/02 188/156 |
| 9,143,065 | B2 * | 9/2015 | Ajima | H02P 6/12 |
| 10,082,442 | B2 * | 9/2018 | Yasui | G01R 19/0092 |
| 10,436,856 | B2 * | 10/2019 | Nakamura | G01R 33/0041 |
| 2015/0369317 | A1 * | 12/2015 | Choe | F16D 65/18 701/70 |
| 2018/0126973 | A1 * | 5/2018 | Choe | B60T 13/741 |
| 2019/0135259 | A1 * | 5/2019 | Jo | B60T 17/221 |

FOREIGN PATENT DOCUMENTS

| KR | 10-2010-0097992 | 9/2010 |
| KR | 10-2016-0042212 | 4/2016 |

\* cited by examiner

Primary Examiner — Christopher P Schwartz
(74) Attorney, Agent, or Firm — Ladas & Parry, LLP

(57) ABSTRACT

Disclosed are an electronic parking brake (EPB) system and a method of controlling the same. The EPB system includes a motor, a first Hall sensor configured to sense a current flowing through the motor, a second Hall sensor configured to sense a current flowing through the motor, and a controller configured to determine the motor to have a failure when a magnetic change of the first Hall sensor and a magnetic change of the second Hall sensor do not match a preset pattern during an apply operation of the motor.

12 Claims, 6 Drawing Sheets

ELECTRONIC PARKING BRAKE SYSTEM IN VEHICLE AND METHOD OF CONTROLLING THE SAME

CROSS-REFERENCE TO RELATED APPLICATION

This application is based on and claims priority under 35 U.S.C. § 119 to Korean Patent Application No. 2017-0100283, filed on Aug. 8, 2017 in the Korean Intellectual Property Office, the disclosure of which is incorporated herein by reference.

BACKGROUND

1. Field

The present invention relates to an electronic parking brake system in a vehicle and a control method thereof, and more specifically, to a circuit for detecting a circuit failure that may occur in a motor driving circuit in an electronic parking brake system of a vehicle.

2. Description of the Related Art

In general, a brake device includes a parking brake, which is generally referred to as a hand brake or a side brake, for keeping the vehicle in a stationary state. The parking brake is operated by a driver manipulating a parking lever provided at one side of a driver seat inside the vehicle. When the driver pulls the parking lever to pull a cable connected to the parking lever, a rear-wheel brake assembly connected to the cable is operated to secure a braking force. On the contrary, in response to releasing the cable lever, the cable is unfastened, and thus the braking force is released.

However, the method of operating the parking brake based on a manipulation of the parking lever is implemented only by the intention of the driver, and when the vehicle is parked in a gradient or the like without pulling the parking lever inadvertently, the vehicle may roll down, causing an unexpected accident. In addition, since the driver needs to operate the parking lever at each time of parking or starting the vehicle, the use of the parking lever is significantly troublesome, particularly for women or elderly people.

Accordingly, in recent years, an electronic parking brake (EPB) system for electronically controlling the driving of the parking brake has been used, and is installed on a normal disc brake to perform a parking brake function.

The EPB system allows the parking brake to be automatically applied or released according to a simple switch manipulation or a determination of control of an ECU that manages the overall control, even when the driver does not operate the parking brake manually.

Such an EPB system includes: an actuator having a motor for generating a braking force; and an ECU for driving the actuator. The ECU includes a controller, a number of sensor interfaces, a motor drive, and a communication module. The ECUECU drives the actuator according to the manipulation state of the switch to apply or release the EPB system.

However, there is a case that the internal failure of a circuit in the ECU is not immediately detected. For example, when the voltage or current across the motor recognized by the ECU is measured to be normal, even though the motor is inoperable due to disconnection of a wire inside the motor or internal defect of the motor during the brake apply operation, the motor drive is kept on until the parking apply operation or release operation is completed. At this time, when the driver leaves the vehicle immediately after pressing a parking button, the vehicle may be rolled back.

SUMMARY

Therefore, it is an object of the present disclosure to provide an electronic parking system in a vehicle and a method of controlling the same, allowing an ECU provided inside a motor to immediately detect an internal failure of the motor, thereby checking whether a parking is properly performed.

Additional aspects of the invention will be set forth in part in the description which follows and, in part, will be obvious from the description, or may be learned by practice of the invention.

Therefore, it is an aspect of the present invention to provide an electronic parking brake (EPB) system including: a motor; a first Hall sensor configured to sense a current flowing through the motor; a second Hall sensor configured to sense a current flowing through the motor; and a controller configured to determine the motor to have a failure when a magnetic change of the first Hall sensor and a magnetic change of the second Hall sensor do not match a preset pattern during an apply operation of the motor.

The controller may be configured to determine whether the motor has a failure when current flowing through the motor is below a preset threshold value and to determine that a parking brake is engaged when current flowing through the motor is equal to or greater than the preset threshold value.

The controller may sense the magnetic changes at a predetermined time interval to determine whether the magnetic changes match the preset pattern.

The controller may warn a malfunction of the EPB system when the motor is determined to has a failure.

The controller may determine whether the second Hall sensor has a failure on the basis of the magnetic change of the first Hall sensor, or determines whether the first Hall sensor has a failure on the basis of the magnetic change of the second Hall sensor.

It is another aspect of the present invention to provide a method of controlling an electronic parking brake (EPB) system including a motor and at least two Hall sensors for sensing a current flowing through the motor, the method including: comparing a magnetic change of a first Hall sensor and a magnetic change of a second Hall sensor with a preset pattern during an apply operation of the motor; and determining the motor to have a failure when the magnetic change of the first Hall sensor and the magnetic change of the second Hall sensor do not match the preset pattern.

The method may further include comparing the magnetic change of the first Hall sensor and the magnetic change of the second Hall sensor with the preset pattern when a current flowing through the motor is below a preset threshold value.

The method may further include sensing the magnetic changes at a predetermined time interval to determine whether the magnetic changes match the preset pattern.

The method may further include warning a malfunction of the EPB system when the motor is determined to have a failure.

The method may further include determining whether the second Hall sensor has a failure on the basis of the magnetic change of the first Hall sensor, or determining whether the first Hall sensor has a failure on the basis of the magnetic change of the second Hall sensor.

BRIEF DESCRIPTION OF THE DRAWINGS

These and/or other aspects of the invention will become apparent and more readily appreciated from the following description of the embodiments, taken in conjunction with the accompanying drawings of which.

DETAILED DESCRIPTION

Hereinafter, embodiments of the present invention will be described in detail with reference to the accompanying drawings. The following embodiments are provided to fully convey the spirit of the present invention to a person having ordinary skill in the art to which the present invention belongs. The present invention is not limited to the embodiments shown herein but may be embodied in other forms. In order to make the description of the present invention clear, unrelated parts are not shown and, the sizes of components are exaggerated for clarity.

An electronic parking brake (EPB) system is classified into a cable puller type EPB system and a motor-on-caliper type EPB system according to the operation scheme, and even when a driver does not apply the parking brake manually, the EPB system automatically operates to keep the vehicle in a parking state or in a stop state when there is a possibility of the vehicle being pushed backward at a time of stopping the vehicle or starting the vehicle on a hill.

Figure 1:
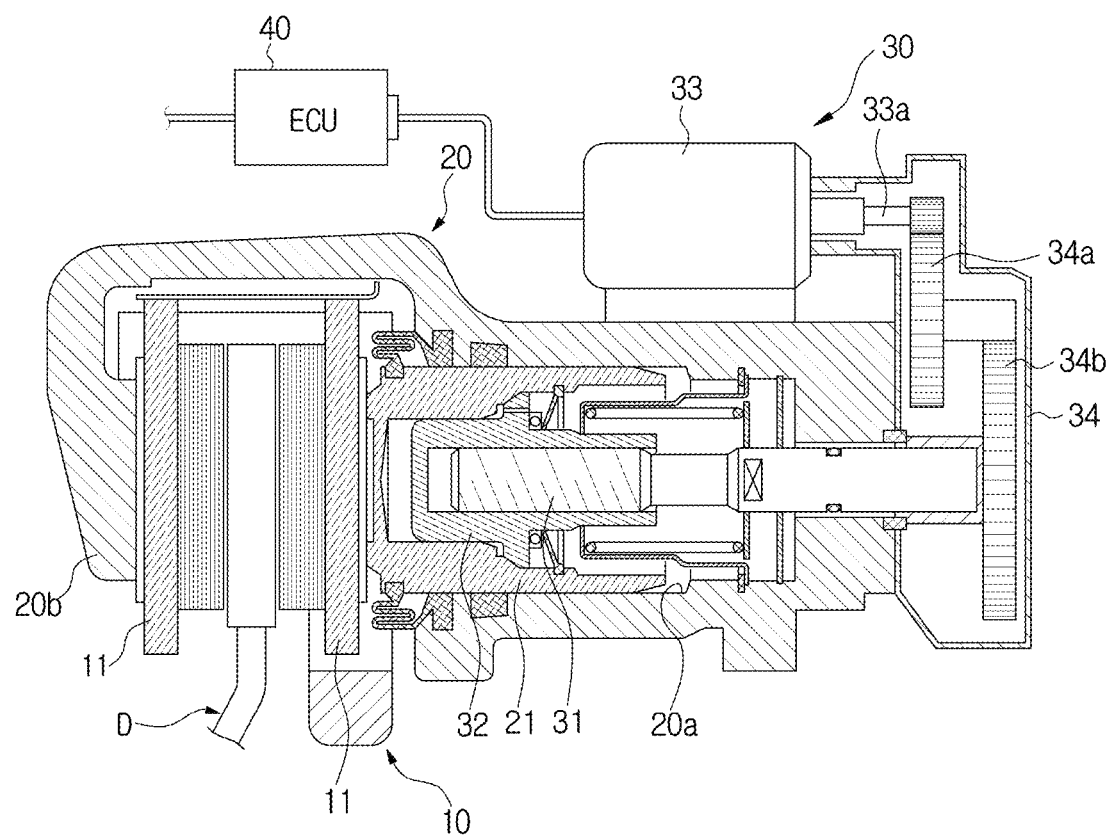
FIG. 1 is a cross-sectional view illustrating a brake that may be used in an embodiment of the present invention.

For the sake of convenience, the following description is made in relation to a motor-on-caliper type EPB system as an example FIG. 1 is a cross-sectional view illustrating a brake that may be used in an embodiment of the present invention.

Referring to FIG. 1, an EPB system includes an EPB actuator 30 for generating a braking force by operating a disc brake 10, 20 provided on a vehicle wheel and an electronic control unit (ECU) 30 for controlling the operation of the EPB actuator 30.

The disc brake 10, 20 include: a carrier 10 coupled to a vehicle body and provided with a pair of friction pads 11 spaced apart from each other by a predetermined distance; and a caliper housing 20 provided at one side thereof with a cylinder portion 20a, in which a piston 21 is installed to reciprocate with respect to the carrier 10 to press the two friction pads 11 against a disc D, and provided at the other side thereof with a finger portion 20b.

The EPB actuator 30 includes an actuating shaft 31 rotatably provided in the cylinder portion 20a of the caliper housing 20, a pressing sleeve 32 installed inside the piston 21 to press or release the piston 21 while moving back and forth by rotation of the actuating shaft 31, a motor 33 for rotating the actuating shaft 31 in the forward and reverse directions, and a reduction gear assembly 34 including a plurality of gears 34a and 34b so as to transmit power generated by a rotary shaft 33a of the motor 33 to the actuating shaft 31 at a reduced rate of rotation.

Figure 2:
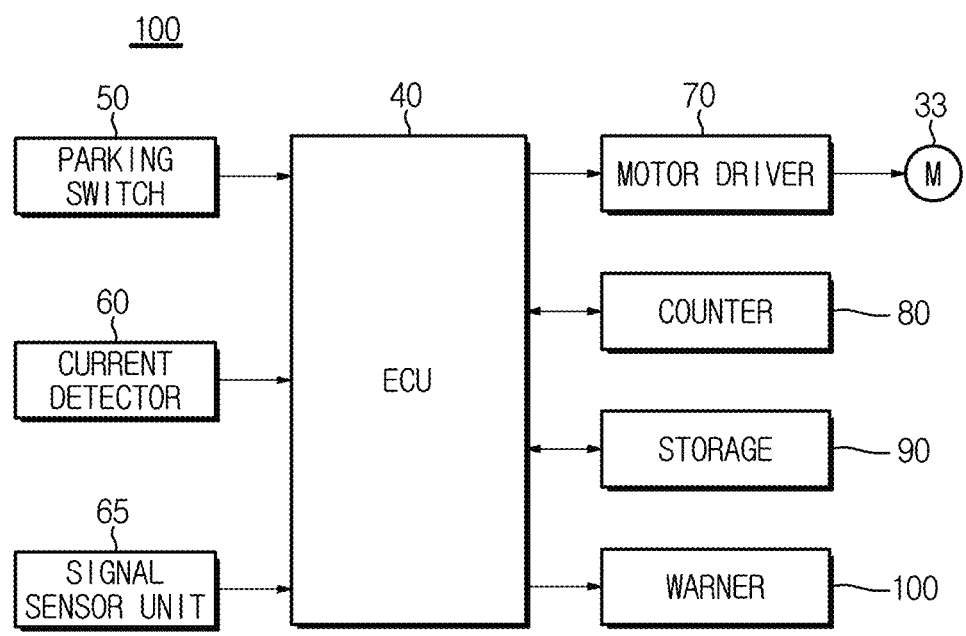
FIG. 2 is a control block diagram illustrating an electronic parking brake (EPB) system according to an embodiment of the present invention.
Figure 3:
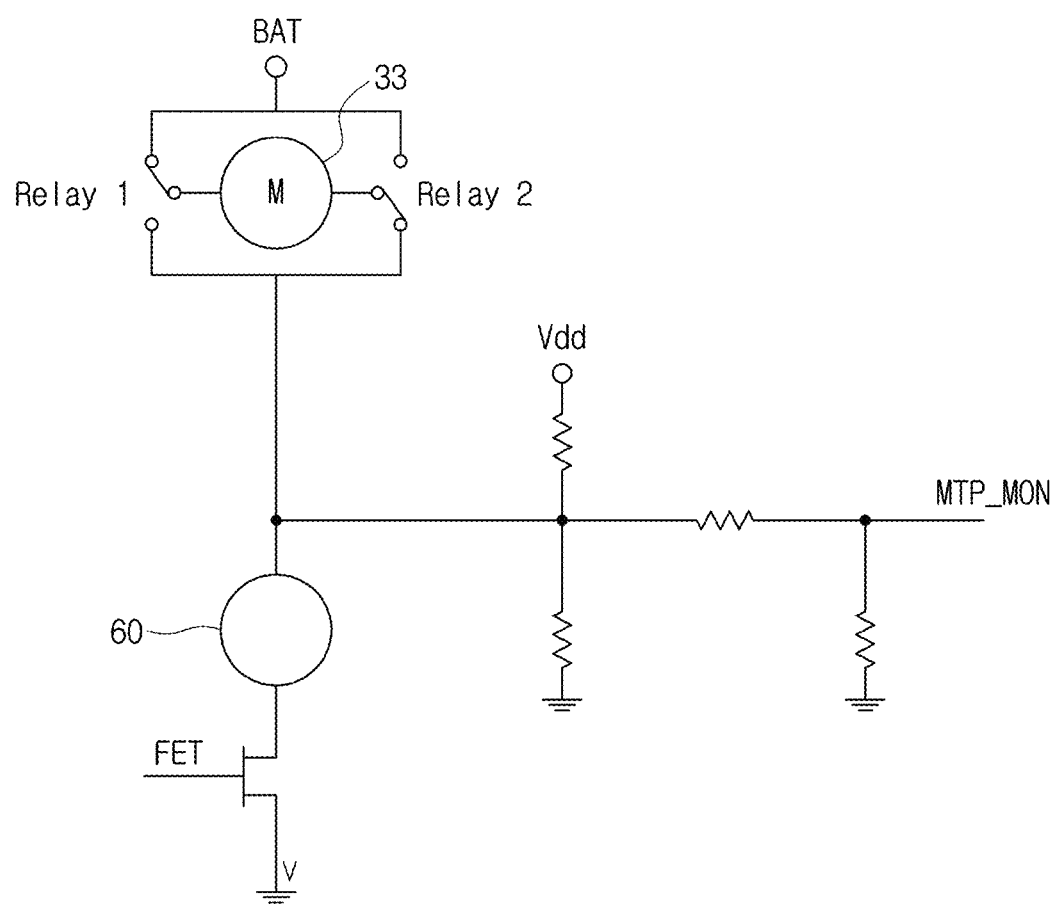
FIG. 3 is an internal circuit diagram of an EPB system according to an embodiment of the present invention.

FIG. 2 is a control block diagram illustrating an EPB system 100 according to an embodiment of the present invention, and FIG. 3 is an internal circuit diagram of the EPB system according to the embodiment of the present invention.

Referring to FIG. 2, an EPB system 100 includes an electronic control unit (ECU) 40 that performs overall control associated with an operation of an electronic parking brake.

The ECU 40 has an input side to which a parking switch 50, a current detector 60 and a signal sensor unit 65 are electrically connected.

The ECU 40 has an output side to which a motor driver 70 and a warner 100 are electrically connected.

The ECU 40 has the output side to which a counter 80 and a storage 90 are electrically connected.

The parking switch 50 transmits a parking apply signal for applying the EPB system to the ECU 40 when the parking switch 50 is manipulated to an on-position by the driver, and transmits a parking release signal for releasing the EPB system to the ECU 40 when the parking switch 50 is manipulated to an off position. That is, depending on the manipulation of the parking switch 50, the EPB system is changed into an apply state or a release state.

The current detector 60 detects a current flowing through the motor 33. For example, the current detector 60 may detect the motor current flowing through the motor using a shunt resistor or a Hall sensor (see FIG. 3). The current detector 60 may be implemented using various methods other than the shut resistor or a Hall sensor, as long as it can detect the motor current.

Figure 4:
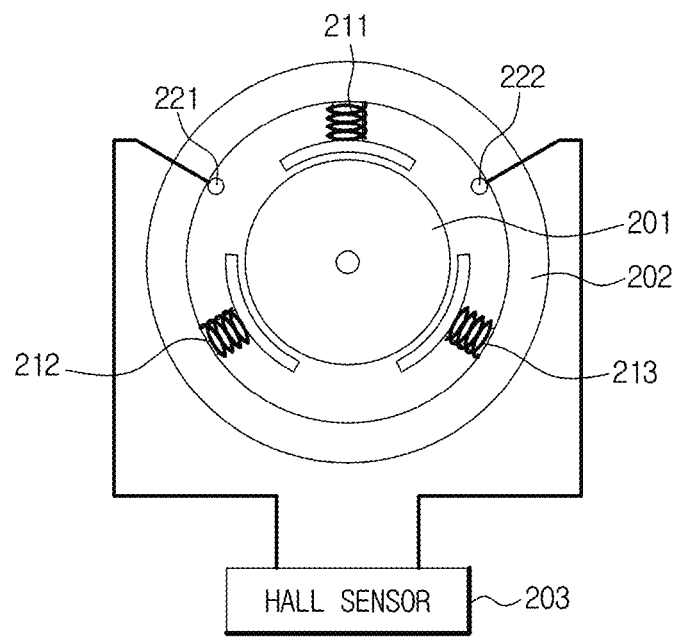
FIG. 4 is a schematic view illustrating a motor included in an EPB system according to an embodiment of the present invention.

The signal sensor unit 65 obtains a signal for determining whether the motor 33 performs a normal operation on the basis of pulse signals of two Hall sensors H1 and H2 located on the motor (see FIG. 4).

The motor driver 70 rotates the motor 33 in forward or reverse directions. For example, the motor driver 70 may include an H-Bridge circuit including a plurality of power switching elements to rotate the motor 33 in the forward and reverse directions. Referring to FIG. 3, the motor driver 70 may turn on a first relay Relay 1 while turning off a second relay Relay 2 to rotate the motor 33 in one direction. Conversely, the motor driver 70 may turn off the first relay Relay 1 while turning on the second relay Relay 2 to rotate the motor 33 in the opposite direction.

For example, when the motor driver 70 turns on the first relay Relay 1 while turning off the second relay Relay 2 to rotate the motor 33 clockwise (CW), so that an apply operation control is performed. In contrary, when the motor driver 70 turns off the first relay Relay 1 while turning on the second relay Relay 2 to rotate the motor 33 counter clockwise (CCW), so that a release operation control is performed.

During a parking apply operation in which the motor 33 is rotated in one direction by the motor driver 70, the rotation in the one direction is decelerated by passing through the reduction gear assembly 34, to thereby rotate the actuating shaft 31 in the one direction with a great force. When the actuating shaft 31 rotates in the one direction, the pressing sleeve 32 is moved in an axial direction to press the piston 21, so that the two friction pads 11 press the disc D to thereby brake the wheel. A parking release operation is implemented in a reverse manner of the parking operation. A pad replacing operation is implemented in the same manner as the parking release operation, except that the motor 33 is controlled such that the actuating shaft 31 is further retracted to enable the pad replacement.

The counter 80 counts the operation time of the motor 33 for each operation mode (a parking apply operation, a parking release operation, and a pad replacement operation).

The storage 90 stores preset values corresponding to the operation modes (a parking apply operation, a parking release operation, and a pad replacement operation) in advance. The preset values are set to be different at each operation mode.

The warner 100 warns the driver of an abnormal operation of the EPB actuator 30. The warner 61 warns the driver of an overload of the motor 33 inside the EPB actuator 30. The warner 100 is implemented using a visual component, such as a warning lamp, or an audible component, such as a buzzer, installed in a proper position in the vehicle, and is configured to operate the warning lamp or the buzzer according to a control signal of the ECU 40, so as to warn the overload of the motor 33. The audible component of the warner 100 may be implemented as a loudspeaker, and the loudspeaker may be implemented using a speaker of a vehicle audio system provided inside the vehicle or using a separate speaker installed in a proper place in the vehicle.

The ECU 40 performs a parking apply operation by rotating the motor 33 of the EPB actuator 30 in one direction through the motor driver 70 in a parking apply mode, to provide the disc brake 10,20 with a parking brake force.

The ECU 40 performs a parking release operation by rotating the motor 33 of the EPB actuator 30 in the opposite direction through the motor driver 70 in a parking release mode, to release the parking brake force provided to the disc brake 10, 20.

In particular, the ECU 40 determines that the parking apply operation of the motor 33 is completed when a current sensed from the motor 33 exceeds a preset current value, and even when the parking operation is performed, continues rotating the motor 33 for parking apply operation in a case when the preset current value is not reached.

In order to detect whether the motor 33 performs a normal operation during the parking apply operation of the motor, the EPB system 100 according to the present invention includes two Hall sensors. Details thereof will be described with reference to FIG. 4.

Referring to FIG. 4, the motor 33 included in the EPB system 100 according to the present invention is a DC motor including a stator 202 having three coils 211 to 213, a rotor 201 having a permanent magnet, and a Hall sensor 203. The Hall sensor 203 includes two magnetic field detectors 221 and 222.

Accordingly, the ECU 40 in the EPB system 100 obtains an output of the Hall sensor 203 and electrically transmits the output to the signal sensor unit 65.

On the basis of the signals obtained as such, the ECU 40 may check whether the motor 33 performs a normal operating, and a method of checking a normal operation based on the sensed signal will be described with reference to pulse signals shown in FIG. 5.

Figure 5:
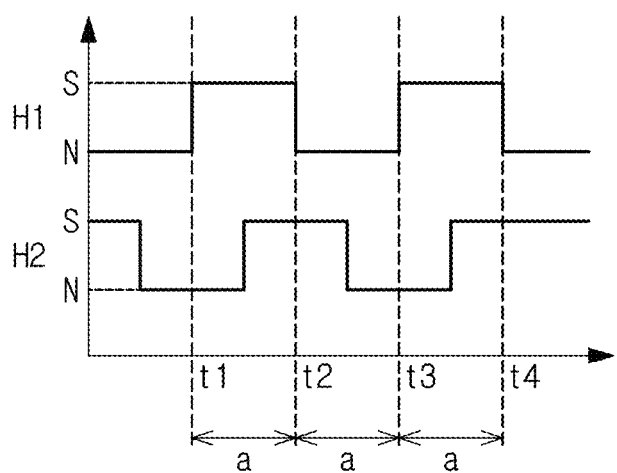
FIG. 5 is a graph showing Hall sensor signals included in an EPB system according to an embodiment of the present invention.

FIG. 5 is a graph showing Hall sensor signals included in the EPB system 100 according to the embodiment of the present invention.

In the EPB system 100 according to the embodiment of the present invention, the magnetism detected by each of the two magnetic field detectors 221 and 222 is obtained at predetermined time intervals.

Referring to FIG. 5, at a time of t1 [sec], it can be seen that the magnetism detected from a signal H1 obtained by a first magnetic field detector 221 indicates a polarity of S, while the magnetism detected from a signal H2 obtained by a second magnetic field detector 222 indicates a polarity of N.

At a time of t2 [sec] after a time interval of a [sec], it can be seen that the magnetism detected from the signal H1 obtained by the first magnetic field detector 221 indicates a polarity of S, while the magnetism detected from the signal H2 obtained by the second magnetic field detector 222 indicates a polarity of S.

At a time of t3 [sec] after a time interval of a [sec], it can be seen that the magnetism detected from the signal H1 obtained by the first magnetic field detector 221 indicates a polarity of N, while the magnetism detected from the signal H2 obtained by the second magnetic field detector 222 indicates a polarity of S.

At a time of t4 [sec] after a time interval of a [sec], it can be seen that the magnetism detected from the signal H1 obtained by the first magnetic field detector 221 indicates a polarity of N, while the magnetism detected from the signal H2 obtained by the second magnetic field detector 222 indicates a polarity of N.

In this case, the ECU 40 may set the time interval a[sec] for sensing the signals in the signal sensor unit 65 to vary with the interval between the first magnetic field detector 221 and the second magnetic field detector 222, and the size of the motor 33

Even when one of the first magnetic field detector 221 and the second magnetic field detector 222 has a failure, the ECU 40 may rapidly identify the failure using pulse signals of the remaining one of the first magnetic field detector 221 and the second magnetic field detector 222.

For example, during the operation of the motor, the ECU 40 may determine that the motor 33 is disconnected when a pattern change from the N polarity to the S polarity or from the S polarity to the N polarity at time intervals. In other words, in response to identifying a pattern change from the N polity to the S polarity or from the S polarity to the N polarity, the ECU 40 determines that the motor is rotating.

In addition, the EPB system 100 according to the present invention may detect signals of the first magnetic field detector 221 and the second magnetic field detector 222 in a neutral state, rather than a parking apply state or a parking release state, thereby specifically classifying a failure type and diagnosing a failure.

As such, magnetic changes in the two Hall sensors 203 are compared with a preset pattern, and when the motor does not exhibit magnetic changes matching the preset pattern that is set for a parking apply operation, the ECU 40 may determine that the motor has a failure.

Accordingly, the EPB system 100 according to the present invention may identify a failure of the motor on the basis of a signal value through the Hall sensor 203 even when the motor is put to an on-state by the driver during parking and a current value is not obtained by the current detector 60.

The EPB system 100 and the method of controlling the same according to the present invention have been described above.

Hereinafter, a method of operating the EPB system 100 according to the present invention will be described.

Figure 6:
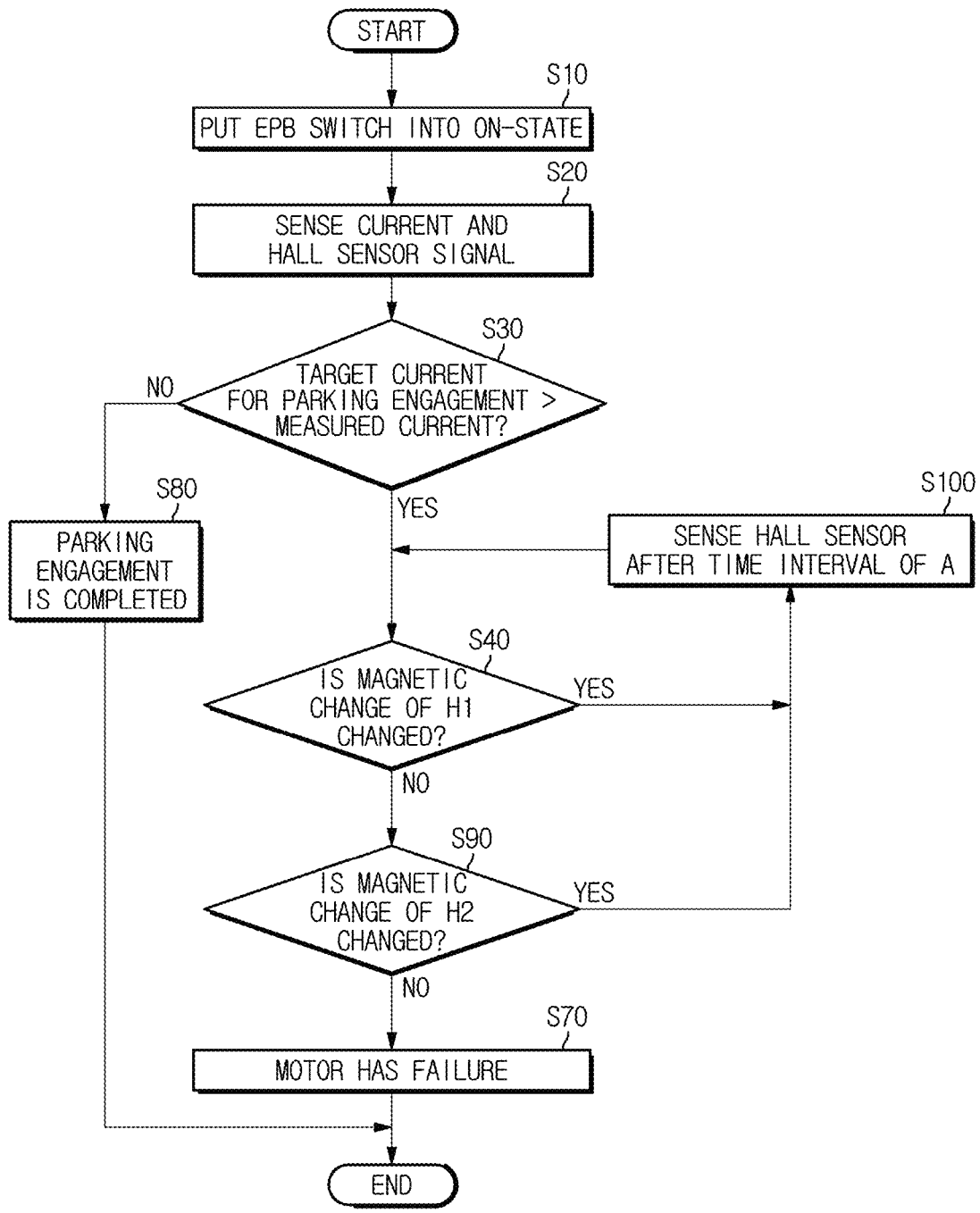
FIG. 6 is a flowchart showing a method of detecting a motor operation in an EPB system according to an embodiment of the present invention.

Referring to FIG. 6, when the parking switch 50 of the EPB system 100 according to the present invention is put to an on-state, an operation of detecting a failure of the motor starts (10).

However, even when the parking switch 50 of the EPB system 100 shown in FIG. 6 is not put to an on-state, the EPB system 100 may detect a failure of the motor.

For example, when the driver applies an accelerator, the parking brake is automatically released, so that the vehicle is allowed to start driving.

In addition, even when a drive command is not transmitted to the motor 3 and the polarity of the Hall sensor 203 is changing, the EPB system 100 may detect a failure of the motor 33.

The EPB system 100 according to the present invention obtains a current flowing through the motor 33 and a signal of the Hall sensor 203 installed in the motor 33 from the current detector 60 and the signal sensor unit 65 (20).

At this time, the ECU 40 determines that engagement for parking is achieved when the amount of measured current is equal to or greater than a target current amount for parking engagement (YES in operation 30) (80).

However, when the amount of measured current is less than the target current amount for parking engagement (NO in operation 30), there is a possibility that current is not sensed due to a failure of the motor 33, and thus the ECU 40 senses the magnetism of the Hall sensor obtained by the signal sensor unit 65 to check whether the motor 33 has a failure.

In detail, a method of determining whether the motor 33 has a failure will be described with reference to operations 40 to 90 in FIG. 6.

When there is no change in magnetism of the signal H1 obtained by the first magnetic field detector 221 installed on the motor 33 (NO in operation 40) and no change in magnetism of the signal H2 obtained by the second magnetic field detector 222 (NO in operation 90), the ECU 40 determines that the motor 33 has an internal failure (70).

When there is a change in magnetism of the signal H1 obtained by the first magnetic field detector 221 installed on the motor 33 (YES in operation 40) and a change in magnetism of the signal H2 obtained by the second magnetic field detector 222 (YES in operation 90), the ECU 40 controls signals of the Hall sensor to be sensed after a preset time interval of a (90).

Even when there is a change in magnetism of the signal H1 obtained by the first magnetic field detector 221 installed on the motor 33 (YES in operation 40) and a change in magnetism of the signal H2 obtained by the second magnetic field detector 222 (YES in operation 90), there is a possibility of having a failure in the first second magnetic field detector 221 or the second magnetic field detector 222, but the failure of the magnetic field detectors is considered out of the question and thus details thereof will be omitted.

As is apparent from the above, the parking of the vehicle can be stably performed by immediately detecting the internal failure of the motor using the ECU inside the motor.

The above description of the present invention is made in relation to the embodiments. A person having ordinary skilled in the art should appreciate that other specific modifications may be easily made without departing from the technical spirit or essential features of the present invention and it should also be understood that all changes or modifications derived from the definitions and scope of the claims and their equivalents fall within the scope of the present invention.

What is claimed is:

1. An electronic parking brake (EPB) system comprising:
a motor;
a first Hall sensor configured to sense a current flowing through the motor;
a second Hall sensor configured to sense a current flowing through the motor; and
a controller configured to determine the motor to have a failure when a magnetic change of the first Hall sensor and a magnetic change of the second Hall sensor do not match a preset pattern during an apply operation of the motor.

2. The EPB system of claim 1, wherein the controller senses the magnetic changes at a predetermined time interval to determine whether the magnetic changes match the preset pattern.

3. The EPB system of claim 2, wherein the controller determines whether the second Hall sensor has a failure on the basis of the magnetic change of the first Hall sensor, or determines whether the first Hall sensor has a failure on the basis of the magnetic change of the second Hall sensor.

4. The EPB system of claim 1, wherein the controller is configured to:
determine whether the motor has a failure when current flowing through the motor is below a preset threshold value; and
determine that a parking brake is engaged when current flowing through the motor is equal to or greater than the preset threshold value.

5. The EPB system of claim 1, wherein the controller warns a malfunction of the EPB system when the motor is determined to has a failure.

6. The EPB system of claim 1, wherein each of the first and second Hall sensors comprise one or more magnetic field detectors configured to detect magnetism, and the controller is configured to compare the magnetic changes of the first and second Hall sensors with the preset pattern.

7. A method of controlling an electronic parking brake (EPB) system including a motor and at least two Hall sensors for sensing a current flowing through the motor, the method comprising:
comparing a magnetic change of a first Hall sensor and a magnetic change of a second Hall sensor with a preset pattern during an apply operation of the motor; and
determining the motor to have a failure when the magnetic change of the first Hall sensor and the magnetic change of the second Hall sensor do not match the preset pattern.

8. The method of claim 7, further comprising sensing the magnetic changes at a predetermined time interval to determine whether the magnetic changes match the preset pattern.

9. The method of claim 8, further comprising determining whether the second Hall sensor has a failure on the basis of the magnetic change of the first Hall sensor, or determining whether the first Hall sensor has a failure on the basis of the magnetic change of the second Hall sensor.

10. The method of claim 7, further comprising comparing the magnetic change of the first Hall sensor and the magnetic change of the second Hall sensor with the preset pattern when a current flowing through the motor is below a preset threshold value.

11. The method of claim 7, further comprising warning a malfunction of the EPB system when the motor is determined to have a failure.

12. The method of claim 7, further comprising detecting, by one or more magnetic field detectors included in each of the first and second Hall sensors, magnetism to compare the magnetic changes of the first and second Hall sensors with the preset pattern.

* * * * *